(12) United States Patent
Aerts

(10) Patent No.: US 9,304,152 B2
(45) Date of Patent: Apr. 5, 2016

(54) CURRENT MONITORING CIRCUITS AND METHODS

(71) Applicant: NXP B.V., Eindhoven (NL)

(72) Inventor: Steven Aerts, Oud-Heverlee (BE)

(73) Assignee: NXP B.V., Eindhoven (NL)

( * ) Notice: Subject to any disclaimer, the term of this patent is extended or adjusted under 35 U.S.C. 154(b) by 264 days.

(21) Appl. No.: 14/102,908

(22) Filed: Dec. 11, 2013

(65) Prior Publication Data

US 2014/0167797 A1    Jun. 19, 2014

(30) Foreign Application Priority Data

Dec. 19, 2012  (EP) .................................... 12198025

(51) Int. Cl.
| | | |
|---|---|---|
| *G01R 31/3187* | (2006.01) | |
| *G01R 19/00* | (2006.01) | |
| *G05F 1/573* | (2006.01) | |
| *G01R 15/08* | (2006.01) | |

(52) U.S. Cl.
CPC ............ *G01R 19/0092* (2013.01); *G05F 1/573* (2013.01); *G01R 15/08* (2013.01); *H03K 2217/0027* (2013.01)

(58) Field of Classification Search
CPC .... G01R 19/0092; G01R 15/08; G01R 19/32; G01R 1/203; G01R 1/30; G01R 31/2607; H03K 19/0963; H03K 19/215; H03K 17/0822; H03K 2217/0027; G05B 19/054; G05B 2219/21154; G05B 19/0425; G05F 3/262; G05F 1/573; G05F 3/30; H02H 11/003; H02H 3/066; H02H 3/085; H02H 33/0842; G06F 1/28

See application file for complete search history.

(56) References Cited

U.S. PATENT DOCUMENTS

| | | | | |
|---|---|---|---|---|
| 5,815,027 A | * | 9/1998 | Tihanyi ................. | G01R 1/203 327/538 |
| 7,122,882 B2 | * | 10/2006 | Lui .................... | H01L 23/49575 257/48 |
| 2004/0155662 A1 | * | 8/2004 | Graf .................... | G01R 19/0092 324/522 |
| 2006/0066276 A1 | * | 3/2006 | Koch .................... | H02H 7/093 318/434 |
| 2006/0091505 A1 | | 5/2006 | Lui et al. | |
| 2006/0114633 A1 | * | 6/2006 | Watanabe .............. | H02H 3/087 361/93.1 |

FOREIGN PATENT DOCUMENTS

EP    0 517 261 A2    12/1992

OTHER PUBLICATIONS

"AN10322, Current Sensing Power MOSFETS" rev. 02, NXP B.V., 10 pgs., retrieved from the Internet at http:/www.nxp.com/documents/application_note/AN10322.pdf (Jun. 24, 2009.

(Continued)

*Primary Examiner* — Vinh Nguyen
(74) *Attorney, Agent, or Firm* — Rajeev Madnawat

(57) ABSTRACT

A current monitoring circuit is disclosed. The current monitoring circuit includes a main transistor arrangement for connection in series with a load and a set of one or more measurement branches in parallel with the main transistor arrangement. Each measurement branch comprises a series resistor and switch for controlling the connection of the branch into circuit. A gate controller is provided for controlling the switching of the main transistor arrangement and branch switches and a sense amplifier is included for measuring a current through the load based on the current flowing through the main transistor arrangement or a branch.

11 Claims, 5 Drawing Sheets

(56) References Cited

OTHER PUBLICATIONS

XP002712058, BUK9MTT-65PBB, Dual TrenchPLUS FET Logic Level FET, rev. 02, NXP B.V., 16 pgs., retrieved from the Internet: http:fwww.nxp.com/productsjmosfetsjautomitivemosfets/BUK99MTT-65PBB.htm. (Aug. 28, 2013).

Extended European Search Report for EP Patent Appln. No. 12198025.4 (Jun. 9, 2013).

* cited by examiner

CURRENT MONITORING CIRCUITS AND METHODS

This invention relates to a current monitoring arrangement for example to provide protection of components, and to current monitoring methods.

Shunt resistors are commonly used for measuring current. In order to minimize voltage drop and power dissipation in the shunt at rated maximum currents, the shunt resistance must be low. Consequently, the voltage measurable across the same shunt will be low for small currents. If wide ranges of currents need to be measured, the needs for amplification can be beyond what is feasible.

This limitation is mainly due to the offset voltage of an amplifier. State-of-the-art stabilized amplifiers may have offset voltages down to a few μV. If high side current sensing is required, as can be required by a target application to avoid split ground, the amplifier must also provide sufficient common mode rejection. State-of-the-art high-side current sense amplifiers are characterized by offset voltage down to mV.

This may not be sufficient to meet accuracy requirements across wide current ranges as required by some applications.

It becomes apparent that with a single shunt resistor and with state-of-the-art amplifiers the wide dynamic range of current measurements cannot be serviced. Thus, auto-ranging solutions which provide a variable gain in the amplification stage only are not sufficient.

Manual ranging solutions, in which a selection is made between one of multiple shunt resistors are known for multimeters. However auto-ranging requires, in addition to the shunt resistor, fast, low-ohmic, high current power switches in order not to interfere with the current dynamics as required by the application and also to provide the required current measurement accuracy. Such solutions thus require the use of power MOSFETs.

Current sensing power MOSFETs are known. These are used for example to provide an effective means of protecting automotive electronic circuits from overcurrent conditions. They offer a low loss method of measuring the load current, eliminating the need for a current shunt resistor. This technology enables switching high currents with low voltage drop and at the same time providing shunt-less measurement of currents according to a fixed ratio. This fixed ratio pushes the dynamic range requirements of the amplification stage beyond prior solutions.

This technology depends on the close matching of transistor cells within a power MOS transistor. A trench MOS transistor device comprises many thousands of transistor cells in parallel. Elements within the device are identical and the DRAIN current is shared equally between them. The more cells that are in parallel for a given MOSFET chip area, the lower its on-state resistance will be.

This principle has been the key driving force for automotive Power MOS transistors for many years. It is possible to isolate the SOURCE connections of several cells from those of the majority and bring them out onto a separate SENSE pin. The Power MOS transistor can now be thought of as two transistors in parallel with a common GATE and DRAIN but separate SOURCE pins as shown in FIG. 1. When the devices are turned on, the load current will be shared as a ratio of their on-state resistances.

The main transistor 1 is provided in one branch a sense transistor 2 is in a parallel branch. The sources are shown connected in FIG. 1, but by providing separate pins, the sense current can be detected and measured independently.

The sense cells pass only a small fraction of the total load current in proportion to the ratio of their areas. This ratio is typically 500:1.

The ratio of current through the main FET to the current through the sense FET is known as the sense ratio (n). This ratio is defined for the condition where the SOURCE and SENSE terminals are held at the same potential. An additional KELVIN connection to the SOURCE metallization enables accurate determination of the SOURCE potential.

A virtual earth current sensing technique for reading the sense current gives the best performance in terms of accuracy and noise immunity over the full temperature range of the device. This makes use of a sensing operational amplifier with a resistive feedback.

More details are disclosed in the NXP application note AN10322 entitled "Current sensing power MOSFETs", rev. 02, 24 Jun. 2009, available on the NXP website at http://www.nxp.com/documents/application_note/AN10322.pdf. This application note will be referred to as "AN10322" below.

According to the invention, there is provided apparatus and methods as defined in the claims.

The invention provides a current monitoring circuit, comprising:

a main transistor arrangement for connection in series with a load;

a set of one or more measurement branches in parallel with the main transistor arrangement, the or each measurement branch comprising a series resistor and switch for controlling the connection of the branch into circuit;

a gate controller for controlling the switching of the main transistor arrangement and branch switches; and a sense amplifier for measuring a current through the load based on the current flowing through the main transistor arrangement or a branch.

This arrangement combines a transistor in one branch for high current sensing and resistive branches for lower current sensing with greater accuracy. The different branches can then be configured according to the desired current sensing range.

In one example, the sense amplifier comprises a voltage sensing amplifier for sensing a source-drain voltage of the main transistor arrangement or a voltage across a branch resistor. In this case, current sensing through the main transistor arrangement is based on measuring the voltage across the intrinsic source drain resistance.

In another example, the main transistor arrangement comprises sense cells and main cells, wherein the sense cells and the main cells share drain and gate connections.

In this case, the current sensing for the main transistor arrangement can be based on measuring current from current sense cells. For this purpose, the sense amplifier can comprise a first part for current sensing of a sense cell current, and a second part for voltage sensing of the voltage across a branch resistor.

The main transistor arrangement can comprise at least a first set of sense cells and a first set of main cells which share a first gate connection, and at least a second set of sense cells and a second set of main cells, which share a second gate connection, with a different ratio of number of sense cells to main cells for the first set as for the second set, and wherein the sense amplifier is controllable to be able to measure a sense current from the first set of sense cells, or from the second set of sense cells.

This provides a configurable main transistor arrangement, which can be used with different sense ratios. The arrangement has at least two sets of sense cells. These are either independently switched, but route their sense current to a common sense output, or else they can be switched together but route their sense current to separate outputs.

Thus, in one example, there is at least a first set of main cells which shares a first gate connection with the first set of sense cells, and a second set of main cells which shares a second gate connection with the second set of sense cells, such that the arrangement has at least two gate connections.

One gate connection is for one pair of main and sense cell sets and the other gate connection is for the other pair of main and sense cell sets. In this way, the arrangement can be controlled to be in one of two configurations. The sense cell sets can then share a sense pin (i.e. the first and second sets of sense cells can share the same source connection) since only one (or both) can be active. There can of course be further sets of sense and main cells.

In another arrangement, the same set of main cells is associated with the first and second sets of sense cells, and they all share the same gate connection. The cells can thus comprise a single set of main cells, and the two or more sets of sense cells.

In this case, the first and second sets of sense cells can have separate source connections from which sense currents can be monitored independently.

In one example the transistor arrangement with multiple sets of sense cells comprises a single transistor. Internally, the different sets of main and sense cells are provided. In another example, the transistor arrangement comprises at least a first transistor having the first set of sense cells and the first set of main cells, and a second transistor having the second set of sense cells and the second set of main cells. Thus, the transistor arrangement can be implemented by parallel sense transistors with different current sensing sensitivities.

In all examples, a main controller can be used for setting a desired circuit setting corresponding to a desired current monitoring range, and the gate controller provides an overload detection signal to the main controller for use in setting the desired circuit setting. In this way, the circuit configuration (i.e. which branch to use, whether to switch off completely in the manner of a fuse, which configuration of the main transistor arrangement) can be controlled dynamically in dependence on the load.

The invention also provides a monitoring device for circuits, comprising a circuit of the invention, wherein the circuit provides a fuse function. The circuit can thus replace fuses by providing an electronically controlled shut off function (by turning off the main transistor and branches where they are also present). The circuit can also be used simply as a command switch to activate or deactivate circuits.

The invention also provides a current monitoring method, comprising:

controlling the switching of a main transistor arrangement and branch switches, wherein the main transistor arrangement is connected in series with a load and a set of one or more measurement branches are in parallel with the main transistor arrangement, the or each measurement branch comprising a series resistor and switch for controlling the connection of the branch into circuit;

measuring a current through the load based on the current flowing through the main transistor arrangement or a branch.

Examples of the invention will now be described with reference to the accompanying drawings, in which.

Figure 4:
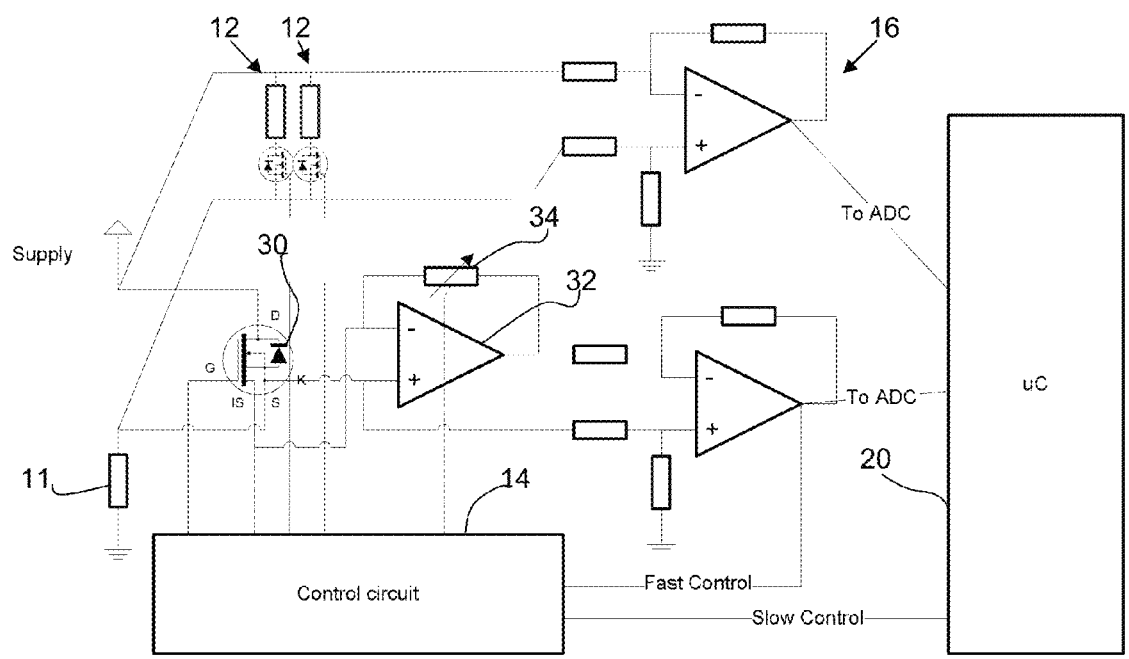
FIG. 4 shows a third example of current sensing circuit.
Figure 5:
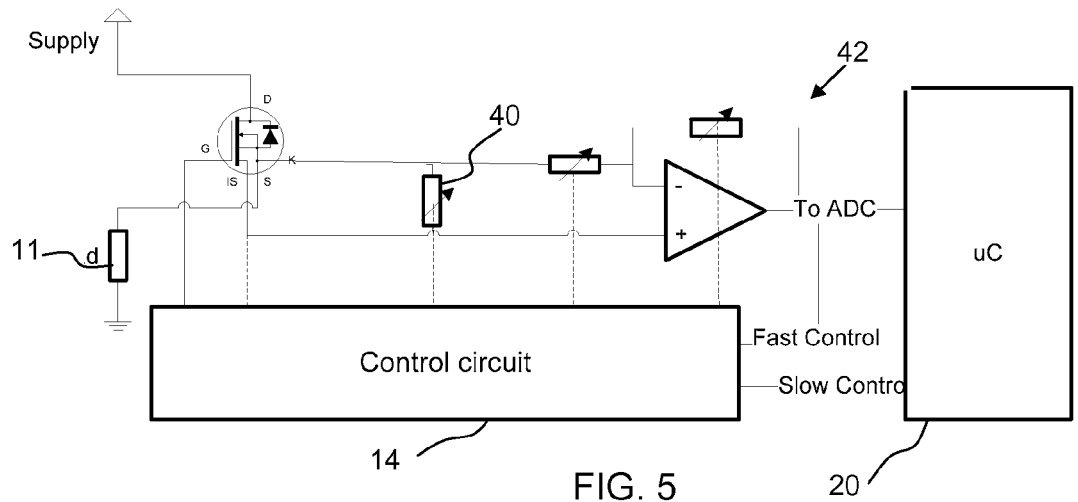
FIG. 5 shows a fourth example of current sensing circuit.
Figure 6A:
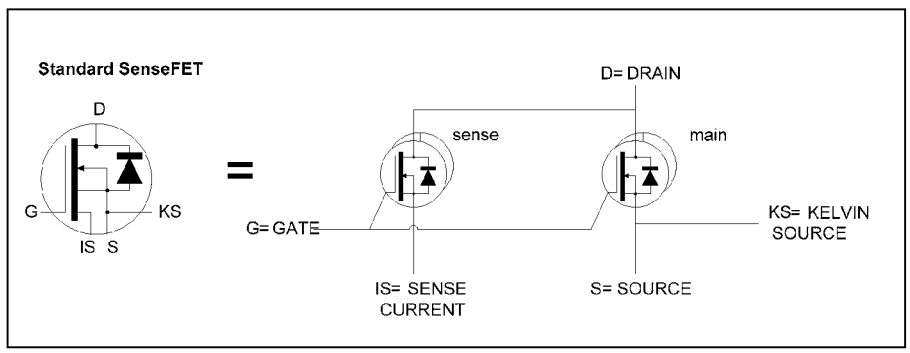
Figure 6B:
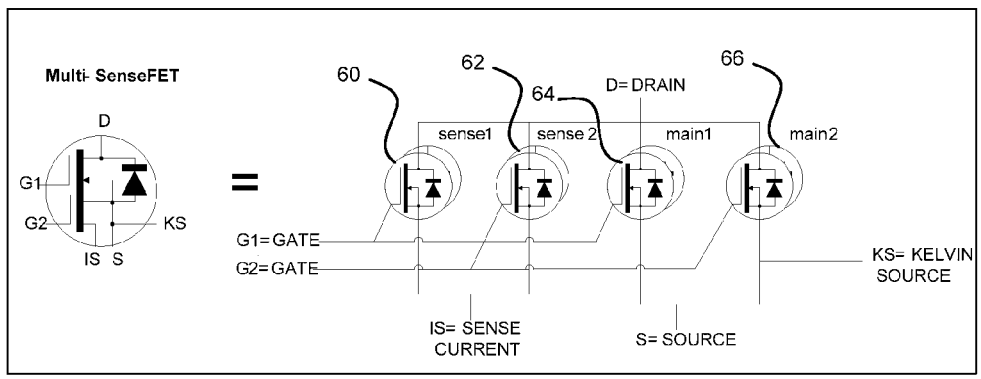
Figure 7:
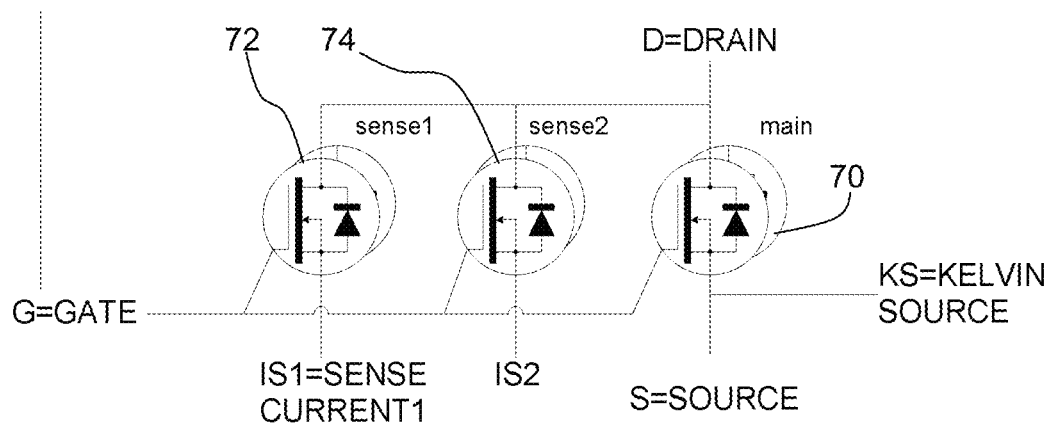

FIGS. 6(a) and 6(b) show examples of sensing transistor for use in the circuits of FIGS. 2 to 5; and FIG. 7 shows a second example of sensing transistor arrangement for use in the circuits of FIGS. 2 to 5.

The invention provides various automatic range scaling solutions for smart power switches to enable current monitoring across a wide dynamic range. In preferred examples, use is made of current sensing transistors. The invention is suitable for overload protection combined with wide range current measurement.

Figure 2:
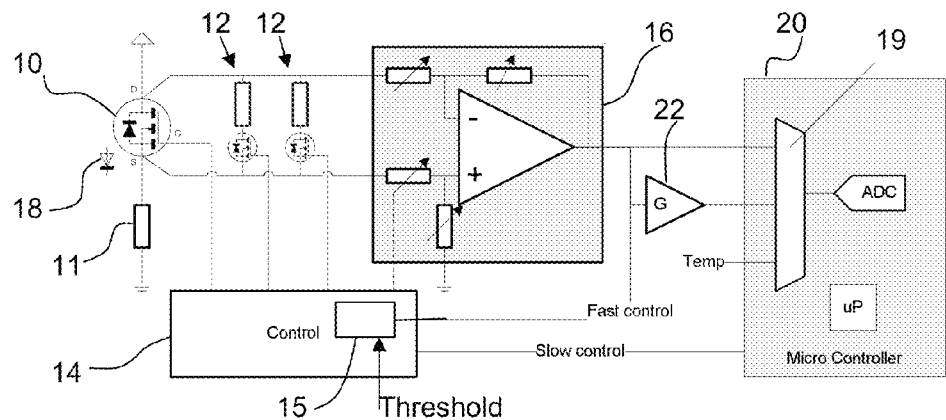
FIG. 2 shows a first example of current sensing circuit.

FIG. 2 shows a first embodiment using a single power MOSFET 10 which delivers current to a load 11, shown schematically as a resistive load. Multiple branches 12 are provided in parallel with the transistor 10, each comprising a series low-current resistor and MOSFET.

These branches provide range scaling and thereby provide extended dynamic range. The branches are controlled by a controller 14, in particular the control determines if they are connected in circuit or not.

The amplification stage 16 is a variable gain current sensing amplifier but based on voltage amplification in this example. A temperature sensor 18 is provided.

The topology shown, with variable resistors at the two amplifier input terminals, a variable negative feedback resistor and a variable ground resistor, is just one schematic example, and any variable gain sensing circuit can be used. A resistor ladder may for example be used for gain setting.

The amplified output is provided to a microcontroller 20 and to a gain element 22.

The gain element enables variable amplification gain to be provided. There are many ways to implement variable amplification gain. In integrated circuits, variable gain is for instance obtained with variable resistors. With discrete components, it is often more effective to implement multiple fixed gain branches. One way to implement this is by post-amplification as provided by gain element 22. There can be a bank of these gain elements. The microcontroller receives inputs from all gain branches and selects the most appropriate branch (i.e. if a high-gain branch input is clipped, it selects the low-gain branch). As such, the dynamic range is extended for a given ADC resolution.

The microcontroller 20 uses a multiplexer 19 which combines the output from the amplifier 16, the gain element 22 and a temperature compensation signal.

The analog multiplexer 19 connects one of multiple analog inputs (low gain current measurement input, high gain current measurement input, temperature sensor input) to a single analog to digital converter (ADC), which is more cost-effective than having multiple ADC's, in case measurement bandwidth is not critical. The microcontroller controls the multiplexer and ADC in order to sequentially sample each of the ADC inputs.

Note that the connection from the temperature sensor 18 to the ADC input is not shown to keep the diagram simple. This connection also involves amplification circuitry.

The arrangement of FIG. 2 eliminates the need of a high-current shunt and applies a power MOSFET for high current switching and measurement, using the power MOSFET $R_{DSON}$ as shunt resistance for measurement of high currents. This has reduced accuracy for these high currents due to spread in $R_{DSON}$. Compensation for this spread may be provided for temperature variations by using the temperature sensor 18.

The control circuitry 14 includes gate drivers as applicable to drive the MOSFET gate voltages.

The control circuitry 14 further provides a number of protection mechanisms, which are typically required to be sufficiently agile and robust, and therefore not left to the control of a microcontroller. Applicable protections may guard for overload, over-temperature and overvoltage conditions, upon which the power FET and any current branches are switched off. Protections other than for overload are not described further but can be easily combined.

In addition to the known protection systems, the example of FIG. 2 (but also FIGS. 4 and 6 described below) can benefit from additional protection. Since for low current operation/measurement the power FET (or part of it in the example of FIGS. 6(a) and 6(b)) may be switched off in order to facilitate range scaling, a sudden increase in current may cause overload or excessive voltage drop, which is measured identically but may have different constraints, for the active branch. Again, circuitry guarding against such overload must be sufficiently agile and robust, and is therefore not left to the control of a microcontroller.

Hence, at least overload protection is facilitated by the control circuit 14, which takes priority over control of the current branches for range scaling. Overload detection may be implemented by detecting the voltage drop across the sensing resistor or drain-source voltage (which is the same), or based on the amplified current at any stage.

A single threshold may be applicable for all branches, or individual thresholds may be applicable per branch.

As overload protection takes precedence over range scaling, the latter may be implemented under control of the microcontroller 20, and it is also envisaged that the current measurement with range scaling is most optimally implemented by the microcontroller 20 with one or more ADC inputs.

The microcontroller 20 requires input from the control circuit 14 as it needs to know that the present scale setting was overridden in the case of overload or any other protection.

According to one implementation, the microcontroller 20 outputs its desired range scale setting, which will be termed a value "DESIRED". Setting 0 corresponds to switching the transistor OFF (which is equivalent to implementing a fuse function), 1 to highest current scale, 2 to a lower current scale and so forth. The control circuit 14 outputs an overload feedback signal (which will be termed "OVERLOAD") when needed.

The "slow control" path shown in FIG. 2 relates to the control provided by the microcontroller, whereas the overload protections are included in the control circuit 14. This "slow control" includes the "DESIRED" setting and "OVERLOAD" feedback signal. The "OVERLOAD" signal is in the form of a flag. Thus, the single slow control connection represents two way connection between the control unit 14 and the microcontroller 20.

The "fast control" path in FIG. 2 relates to feedback of the amplified current sense signal. The control circuit 14 has an overload detector 15 which can use this output of the current sense amplifier. This signal, within a scale proportional to the load current, is compared to a threshold ("Threshold") in order to detect overload. Typically, the amplification gain(s) is (are) chosen such that, for each scale, the maximum current will result in approximately full scale of the ADC input. Hence, the threshold can be chosen at a voltage approximately corresponding to the ADC full scale value.

The control circuit 14 operates as follows:
  Upon overload, an OVERLOAD signal is activated and the actual range scale setting (which will be termed "ACTUAL") decrements by 1. This means the next higher current branch becomes selected or, if the previous branch was the highest current branch, the OFF (fuse function) is selected and all branches are disabled. Thus, the branches adapt dynamically to overload detection so that the lowest current setting is used, but the system adapts to higher current settings when needed, as detected by overload detection.

The OVERLOAD signal remains until the DESIRED setting from the microcontroller equals the ACTUAL setting (thereby providing acknowledgement). This signaling between the control circuit 14 and the microcontroller 20 implies a handshake. As described, the control circuit does not de-assert OVERLOAD as long as DESIRED does not equal ACTUAL, so the microcontroller is able to track the ACTUAL setting. The control circuit (ACTUAL) acts immediately upon overload, such as short-circuit, but the microcontroller (DESIRED) will lag.

Until the microcontroller has increased DESIRED to match ACTUAL, the OVERLOAD feedback signal remains asserted. So even if the overload condition disappears, the microcontroller must have observed and acknowledged it (increasing DESIRED to match ACTUAL) before the control circuit will de-assert OVERLOAD. Otherwise, since DESIRED lags, the control circuit may transition (even return from fused/off state) without the microcontroller noticing it.

If no overload is present and the OVERLOAD feedback signal is not set, the ACTUAL value is updated to equal the DESIRED value in one step or by increments/decrements towards the DESIRED value. Overlap must be ensured whenever switching from one current branch to another to avoid surges.

The microcontroller 20 operates as follows:
  To acknowledge fused state or switch off of the switch, it sets DESIRED=0.
  To switch on the switch (when switch was off, DESIRED was 0) it sets DESIRED=1.
  If OVERLOAD is set, it decrements DESIRED to move towards a higher current setting.
  If DESIRED becomes 0, it signals fused state for diagnostics and decision
  As long as OVERLOAD is not set:
  As long as it knows that ACTUAL=DESIRED it can measure current according to the current scale (sample with ADC, process, transfer, etc.).
  If the measured current is too low for accurate measurement, it increments DESIRED by 1 (towards a lower current setting) to scale the range. This is limited to the number of switches/scales provided. The controller may first increase the amplifier gains if used; finally if the current is still too low at the highest amplifier gain it can then switch back to the lowest amplifier gain and then increment the desired value. Since the control circuit is very agile, it may assume that ACTUAL immediately follows DESIRED if OVERLOAD is not set, and current can be measured after limited settling.
  If the measured current is close to the ADC's full scale, it increments DESIRED by 1 to scale the range. Again, it may first decrease amplifier gains if used; finally if at full scale at lowest amplifier gain it switches back to highest amplifier gain then performs the increment.
  If properly dimensioned (i.e. all gains are properly calculated at design time), the lowest gain (that is scale value 1) is such that the highest allowed current will not cause clipping (i.e. signal amplitudes beyond full scale). In such case, the overload protection should have activated by switching to the fused/off state.

The general operation of the circuit is that for smaller currents, the power MOSFET is switched off and the parallel branch 14 (or one of the parallel branches if there is more than one) with a current shunt is activated to provide higher accuracy. Whenever there is overload detected, the circuit switches back to a higher current branch or to the main MOSFET. Multiple parallel branches may accommodate a wide range by means of increasing shunt resistance, i.e. a resistor ladder.

The current shunts and related switches may be rated at much lower currents, thereby significantly lowering the installation cost.

Thus, the circuit has (at least) two configurations. One makes use of a power MOSFET with integrated current sensing, to deliver large currents to the load and measure those large currents. The other mode places a selected sense resistor in series with the load for delivering small currents to the load and for measuring the current flowing.

The discussion above of the control circuit 14 and the microcontroller 20 applies generally to the circuits described below, although the control circuit 14 controls different combinations of devices in the various examples. In some examples, there is only the power MOSFET to configure and in other examples there are branches to control. The discussion of the control circuits and microcontroller operation will not be repeated.

Figure 3:
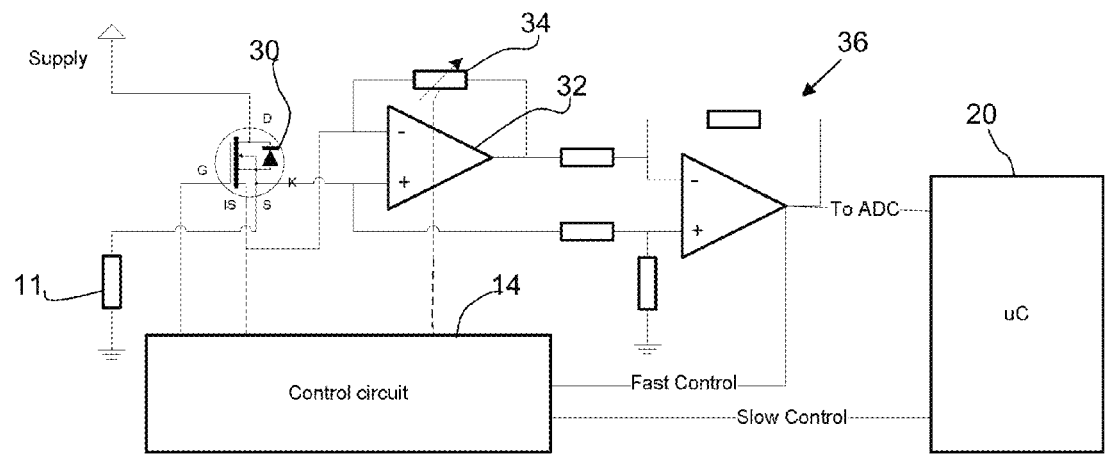
FIG. 3 shows a second example of current sensing circuit.

FIG. 3 shows a second example of circuit.

The second example overcomes the limitation of the first example of reduced accuracy due to the spread of RDSON. By applying sensing FET technology as outline above, sufficient accuracy (such as 3-5%) is provided across the rated temperature range, thereby as well eliminating the need for temperature compensation.

Figure 1:
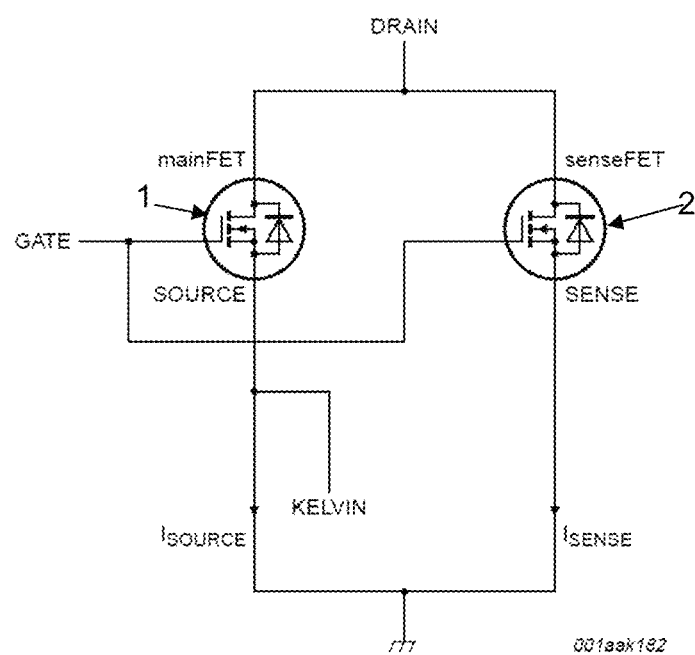
FIG. 1 shows a known transistor design with integrated current sensing capability.

The power MOSFET with internal current sensing is shown as 30. The two current branches (shown in FIG. 1) are separated with the main MOSFET source supplying the load, and the sense FET supplying the inverting terminal of the amplifier 32. The non-inverting terminal of the amplifier is connected to the Kelvin main FET source connection. The two terminals of the amplifier are thus connected to virtual earth. A variable negative feedback sense resistor 34 provides gain control, and the amplifier provides wide dynamic range current sensing.

The amplifier has a second stage 36. The first amplifier has a common mode voltage which equals the MOSFET's source voltage. The second stage 36 is a difference amplifier and removes this common mode voltage.

The variable gain is controlled by control circuitry 14 by making the sense resistor 34 connected to the first amplifier configurable, such as with a resistor ladder, in order to obtain range scaling.

The dynamic range of this example is extended with respect to the prior art. Limiting factors may again be the offset voltage or offset currents of the amplifier, or of the sense FET.

The control circuit and microcontroller provide the fast and slow control as discussed above.

FIG. 4 shows a third example combining the sense FET technology with range scaling.

The third example basically combines the first two examples, and the same reference numbers are used. The sense FET 30 and the branches 12 are in parallel. This configuration overcomes the limitations of both previous examples.

Since the most optimal sense FET circuit requires a current amplifier 32 and the resistor shunts require a voltage amplifier 16, the high and low current branches are separated. As in the first example, the power MOSFET is switched on for the measurement of high currents, though its accuracy, and the possible current range is extended as described above. For low currents, the sense FET is disabled as described above for the first example.

FIG. 5 shows a fourth example combining a sense FET with range scaling.

The fourth embodiment applies auto-ranging to an alternative application of the sense transistor as described in AN10322 chapter 4.

This arrangement makes use of an external resistor 40 in series with the sense output to provide a simpler technique for monitoring the current through the device, based on voltage sensing.

It has the same limitations as the second example, and is provided here for completeness.

FIGS. 6(a) and 6(b) show a fifth example exploiting the basic principle of the sense FET as explained above.

The sense cells pass a small fraction of the total load current in proportion to the ratio of their sense:main FET areas/cells, which ratio is according to prior art fixed, typically at 1:500.

This example provides auto-ranging by dynamically switching the active fraction of sense and/or main FET cells/areas, such that a variable sense ratio is obtained.

FIG. 6(a) shows the conventional sense FET structure, with a bank of main FETs in parallel with a bank of sense FETs. The main FET source is used for supply current to the load (or draining current to earth from the load) and the sense FET source provides the sense current.

FIG. 6(b) shows the sense FET configuration of this example. The sense and/or main FET areas/cells are further divided, and with for example two separate GATE connections G1, G2, such that these distinct GATE connections control the active fraction of cells/areas and hence the sense ratio.

The sense FET thus has at least a first bank of sense cells 60 and a second bank of sense cells 62 with independent control of the gate signals. The sense FET has at least a first bank of main cells 64 and a second bank of sense cells 66 again with independent control of the gate signals. One gate signal can be shared by the first bank of sense and main cells, and another gate signal can be shared by a second gate signal.

The sense ratio is thus adjustable, i.e. sense1:main1 is the sense ration when gate signal G1 is enabled, and sense2:main2 is the sense ratio when gate G2 is enabled. There is a third sense ratio of (sense1+sense2):(main1+main2) with both gate signals G1,G2 enabled.

Since the sense FET technology depends on close matching of transistor cells, it may be observed that this is most optimally achieved within a single device.

Such a device is not on the market today. However, to implement this example of the invention with existing devices, multiple sense FET devices can be applied in parallel. Close matching of the multiple devices is then desirable.

This approach can be combined with any of the previous examples.

FIG. 7 shows a further variation, in which there is only one set of main cells 70, and two sets of sense cells 72,74, so that again each sense cell current output is based on a different ratio. This requires only a single gate connection. The sets of sense cells each have a separate source connection so that the sense currents can be monitored independently.

Generally, the system provides best accuracy if the dynamic range is equally divided amongst stages. With low-cost amplifiers and 10-bits ADC, a dynamic range of 1000:1 may be obtained with 32:1 dual amplifier gains at accuracy within a few %. Much larger amplifier gains become more costly, and beyond +/−1000 hardly feasible with state-of-the-art.

In all figures, the load is shown as a resistor. However, any type of load may be attached to the supply through the switch. Topologies given of amplification circuitry are only for reference and not meant to be restrictive.

Any embodiments of the invention may also be combined with variable gain amplification and/or multiple gain branches, and this is shown in some of the drawings. These provisions are well-known but can be insufficient alone to satisfy requirements.

The invention can be used in any current monitoring application. One example is automobile applications, where the circuits can act as a replacement for fuse.

Various modifications will be apparent to those skilled in the art.

The invention claimed is:

1. A current monitoring circuit, comprising:
 a main transistor arrangement for connection in series with a load;
 a set of measurement branches in parallel with the main transistor arrangement, each measurement branch comprising a series resistor and switch for controlling the connection of the branch into circuit;
 a gate controller for controlling the switching of the main transistor arrangement and branch switches; and
 a sense amplifier for measuring a current through the load based on the current flowing through the main transistor arrangement or a branch.

2. A circuit as claimed in claim 1, wherein the sense amplifier comprises a voltage sensing amplifier for sensing a source-drain voltage of the main transistor arrangement or a voltage across a branch resistor.

3. A circuit as claimed in claim 1, wherein the main transistor arrangement comprises sense cells and main cells, wherein the sense cells and the main cells share drain and gate connections.

4. A circuit as claimed in claim 3, wherein the sense amplifier comprises a first part for current sensing of a sense cell current, and a second part for voltage sensing of the voltage across a branch resistor.

5. A circuit as claimed in claim 1, wherein the main transistor arrangement comprises at least first and second sets of sense cells and at least one set of main cells, wherein each set of sense cells shares drain and gate connections with an associated set of main cells, with a different ratio of number first and second sets of sense cells to associated main cell,
 and wherein the sense amplifier is controllable to be able to measure a sense current from the first set of sense cells, or from the second set of sense cells.

6. A circuit as claimed in claim 5, wherein a same set of main cells is associated with the first and second sets of sense cells, and they all share the same gate connection.

7. A circuit as claimed in claim 6, wherein the first and second sets of sense cells have separate source connections from which sense currents can be monitored independently.

8. A circuit as claimed claim 5, wherein the transistor arrangement comprises a single transistor.

9. A circuit as claimed in claim 5, wherein the transistor arrangement comprises at least a first transistor having the first set of sense cells and a first set of main cells, and a second transistor having the second set of sense cells and a second set of main cells.

10. A circuit as claimed in claim 5, further comprising a main controller for setting a desired circuit setting corresponding to a desired current monitoring range, and wherein the gate controller provides an overload detection signal to the main controller for use in setting the desired circuit setting.

11. A current monitoring method, comprising:
 controlling the switching of a main transistor arrangement and branch switches, wherein the main transistor arrangement is connected in series with a load and a set of measurement branches are in parallel with the main transistor arrangement, each measurement branch comprising a series resistor and a switch for controlling the connection of the branch into circuit;
 measuring a current through the load based on the current flowing through the main transistor arrangement or a branch.

* * * * *